(12) United States Patent
Marion

(10) Patent No.: US 7,938,311 B2
(45) Date of Patent: May 10, 2011

(54) METHOD FOR HYBRIDIZATION OF TWO COMPONENTS BY USING DIFFERENT SIZED SOLDER PROTRUSIONS AND A DEVICE THAT USES TWO COMPONENTS HYBRIDIZED ACCORDING TO THIS METHOD

(75) Inventor: Francois Marion, Saint Martin le Vinoux (FR)

(73) Assignee: Commissariat a l'Energie Atomique, Paris (FR)

( * ) Notice: Subject to any disclaimer, the term of this patent is extended or adjusted under 35 U.S.C. 154(b) by 442 days.

(21) Appl. No.: 11/495,214

(22) Filed: Jul. 28, 2006

(65) Prior Publication Data
US 2007/0045387 A1 Mar. 1, 2007

(30) Foreign Application Priority Data

Aug. 30, 2005 (FR) ...................... 05 52613

(51) Int. Cl.
*B23K 31/02* (2006.01)
(52) U.S. Cl. ................................. 228/180.22
(58) Field of Classification Search ............. 228/180.22
See application file for complete search history.

(56) References Cited

U.S. PATENT DOCUMENTS

| 3,871,015 | A | 3/1975 | Lin et al. |
| 5,894,984 | A | 4/1999 | Sakai et al. |
| 6,170,155 | B1 | 1/2001 | Marion |
| 6,184,586 | B1 | 2/2001 | Matsushima |
| 6,730,541 | B2 * | 5/2004 | Heinen et al. ................. 438/108 |
| 6,876,008 | B2 * | 4/2005 | Bhat et al. ........................ 257/99 |
| 6,919,227 | B2 * | 7/2005 | Nishiyama .................... 438/109 |
| 6,927,491 | B1 | 8/2005 | Yamada |
| 2002/0071642 | A1 * | 6/2002 | Nakata ............................ 385/88 |
| 2003/0132519 | A1 * | 7/2003 | Huang ........................... 257/738 |
| 2003/0197286 | A1 | 10/2003 | Hilton |
| 2005/0161493 | A1 * | 7/2005 | Ference et al. ........... 228/180.22 |

FOREIGN PATENT DOCUMENTS

| DE | 41 01 042 C1 | 2/1992 |
| DE | 101 36 152 A1 | 10/2002 |
| FR | 2 748 849 A1 | 11/1997 |
| JP | 07263449 A * | 10/1995 |
| JP | 09-307022 A1 | 11/1997 |
| JP | 11111771 A * | 4/1999 |
| JP | 11317468 A * | 11/1999 |
| JP | 2001257289 A * | 9/2001 |
| JP | 2005044865 A * | 2/2005 |

OTHER PUBLICATIONS

Blackwell, Glenn R., The Electronic Packaging Handbook, CRC Press 2000, p. 7-18.*

* cited by examiner

*Primary Examiner* — Jessica L Ward
*Assistant Examiner* — Jacky Yuen
(74) *Attorney, Agent, or Firm* — Burr & Brown

(57) ABSTRACT

The hybridization method provides a first component with first pads and a second component with second pads for accommodating protrusions of a fusible material, so that the first pads and second pads line up two by two in order to form pairs of pads to interconnect the two components when aligned. Then placing the first and second components one on top of the other to form an assembly where some of the protrusions of fusible material on the first and/or second pads respectively consist of at least three larger-sized protrusions, especially taller protrusions, so that before the temperature is increased to the hybridization temperature of the fusible material, the component only rests on the larger protrusions.

4 Claims, 5 Drawing Sheets

METHOD FOR HYBRIDIZATION OF TWO COMPONENTS BY USING DIFFERENT SIZED SOLDER PROTRUSIONS AND A DEVICE THAT USES TWO COMPONENTS HYBRIDIZED ACCORDING TO THIS METHOD

FIELD OF THE INVENTION

The present invention relates to the field of microelectronics and, more especially, techniques for the hybridization of different components using interconnection bumps. It is applicable in particular to the fabrication of large-array type devices for detecting electromagnetic radiation. Arrays for detecting x-rays or infrared radiation are the main arrays referred to.

Within the meaning of this invention, the term "component" is taken to mean an electronic component such as an electronic chip, an electronic or optoelectronic circuit substrate or a mechanical component of the protective cover type or a sensor for physical quantities.

BACKGROUND OF THE INVENTION

The hybridization technique referred to by the present invention is confined to hybridization by fusion. This technique, which is widely known, uses bumps made of a fusible material such as a tin-lead alloy, tin-indium alloy or even pure indium.

Briefly, this hybridization technique by fusion involves:
 depositing bumps of fusible material on bonding pads produced on one of the components, said pads consisting of a material that can be wetted by the material that constitutes the solder bumps;
 and then providing the other component that is to be hybridized with pads also consisting of a material that can be wetted by the material that constitutes the solder bumps, said pads being arranged substantially opposite the pads of said first component when said second component is mounted on the first component;
 then, by increasing the temperature until a temperature in excess of the melting temperature of the material that constitutes the bumps is reached, obtaining fusion of the latter until the desired result is achieved, namely hybridization of the second component on the first component, said bumps creating a mechanical and/or electrical link between the pads of each of the components.

For components having relatively small dimensions, the accuracy with which said components are positioned relative to each other when the upper component is mounted on the lower component is not very critical. In fact, the surface tension phenomena that affect hybridization bumps during the fusion process produce automatic alignment of said components. In addition, these surface tension phenomena make it possible to compensate, at least partially, for the thermal expansion phenomena that affects two components having different thermal expansion coefficients and which result in the movement of the pads of one component relative to those of the other component.

For components having larger dimensions, one known technical solution associated with the problem of differential expansion of components involves compensating for expansion phenomena by taking action in terms of the actual design of the components.

Thus, Document FR 2,748,849 proposes moving the wettable surfaces of the component that is to be hybridized linearly and homothety so that, at the hybridization temperature, said wettable surfaces are located substantially opposite each other and not out of alignment with the wettable surfaces or pads of the other component, thereby compensating for this differential expansion.

FIGS. 1a and 1b schematically show the underlying principle of the technical solution adopted in this document, FIG. 1a showing a schematic cross-sectional view before hybridization of a component system that is to be hybridized at ambient temperature and FIG. 1b showing a view similar to FIG. 1a but at the hybridization temperature of the components.

In FIGS. 1a and 1b, 1 denotes the substrate, made of silicon for example, and 2 denotes the cover intended to be mounted on the substrate. Substrate 1 has wettable areas 3, typically made of gold, with a prior barrier based on an alloy of titanium or nickel on which hybridization bumps 4 are deposited. Wettable surfaces 5 are produced on the lower surface of cover 2 in the same way, but without any hybridization bumps. According to the teaching of this document, at ambient temperature the wettable surfaces 5 of cover 2 are not located opposite the wettable surfaces 3 of substrate 1 when said cover is mounted on said substrate.

However, because of the difference in the thermal expansion coefficients of the substrate $\alpha 1$ and of the cover $\alpha 2$ respectively, when the hybridization temperature which exceeds the melting temperature of the material that constitutes bumps 4 is reached, wettable surfaces 5 of said cover move and position themselves substantially opposite the wettable surfaces 3 of substrate 1 so that hybridization is possible as shown in FIG. 1b.

However, although the process described in this document works satisfactorily for arrays of relatively small size, especially arrays measuring less than 1000×1000 pixels, arrays having larger dimensions encounter a certain number of technical problems.

Firstly, the design of the components according to this document is based on the principle of offsetting the wettable surfaces because of thermal expansions that are substantially uniform relative to a barycenter. Unfortunately, because of constraints associated with the actual fabrication of these components, obtaining perfect, regular surfaces, especially those surfaces of the components in question that are intended to be opposite each other, is an ideal that is difficult to achieve and what the technology describes as fixed points or sticking points shown by arrow A in FIG. 2a are often created. Given this, because of these sticking points, thermal expansion, especially that of the cover in the example described, will take place from the sticking point rather than from a substantially central point of the array and will cause considerable misalignment of the wettable surfaces that are farthest away from the sticking point as shown by arrow B in FIG. 2a.

In fact, if L denotes the distance between the two most extreme wettable areas of the substrate and if this distance comprises N pixels, this gives the equation L=(N−1)×pitch, the pitch being commonly defined as the distance separating two consecutive pixels.

Consequently, if D denotes the misalignment between one bump or a wettable area of substrate 1 and the wettable area with which it is intended to cooperate on cover 2, this gives the following equation:

$$D=(\alpha 2-\alpha 1)\times(Th-Ta)\times L/2=(\alpha 2-\alpha 1)\times(Th-Ta)\times(N-1)/2\times pitch$$

in accordance with the teaching of the above-mentioned document where Th is the hybridization temperature and Ta is ambient temperature.

Thus, by way of example, for an array of cadmium telluride CdTe comprising 4000×4000 pixels hybridized on silicon with a pitch of 10 µm and measuring 40×40 cm, having a variation in thermal expansion coefficients $\alpha 2-\alpha 1$ of the order of $3 \times 10^{-6}$, the differential expansion D for a temperature difference of 170° C. equals 1.2 pitch increments.

In other words, when the chips are deposited, the penultimate bump N−1 on the periphery of the lower chip, in this case substrate 1, is located opposite wettable surface N of the upper chip 2. This compensation for expansion results in misalignment equal to one pixel, as shown in FIG. 2*b* (on the right-hand side). Besides linear expansion, practical experience has demonstrated the occurrence of rational or circular expansion and even other types of movement.

In other words, the technical problem which the present invention intends to solve is the fact that the barycenter of expansion is not controlled due to the existence of sticking points created by the topologies adopted by the various technologies. The most prominent point of the surfaces that are in contact may constitute the center of expansion and thus disrupt hybridization of components. Although, for small-size components, this problem is mitigated by the fact that misalignment remains less than the value of the spacing pitch, with larger components this defect may have a significant impact on manufacturing yields.

SUMMARY OF THE INVENTION

The present invention therefore aims to overcome this drawback, especially for components having larger dimensions. Overall, it intends to position wedge-like features in the component medium in order not to affect the actual solder elements themselves, especially before hybridization. According to the invention, the wedges and the solder elements may have various shapes. They are subsequently referred to indiscriminately as "bumps", without this term necessarily implying a spherical shape.

More precisely, the invention refers to a hybridization method using solder protrusions of a first component with a second component involving:

providing the first component with first pads for accommodating protrusions, said first component having a first thermal expansion coefficient, providing the second component with second pads for accommodating protrusions, said second component having a second thermal expansion coefficient, the first and second pads respectively being intended to line up two by two in order to form pairs of pads and the first and second pads being made on the first and second components at locations such that:

at the hybridization temperature Th, the first and second pads of each pair of pads are substantially superposable, and at ambient temperature Ta, the pads of each pair of pads are offset relative to each other by a distance that compensates for differential expansion of the first and second components between ambient temperature Ta and hybridization temperature Th, then providing the first pads and/or second pads with protrusions made of a fusible material, then placing the first and second components one on top of the other, then bringing the assembly consisting of the first and second components and consequently the solder protrusions to a soldering temperature Th in order to interconnect the first and second pads of each pair of pads by soldering the protrusions to these pads, and finally, cooling down the soldered joint thus obtained.

According to the invention, some of the bumps or protrusions of fusible material fitted on the first and/or second pads consist of at least three larger-sized bumps, especially taller bumps, so that before the temperature is increased to the hybridization temperature Th, the component only rests on the larger bumps.

In addition, these larger bumps referred to as "wedge bumps" are positioned substantially in the center of said first and/or second components.

Using this method, the expansion barycenter is forced to the center of the hybridized chip because of this limited area of contact.

As will have become apparent, these special bumps (at least three in number) to ensure effective elevation of the component to be mounted relative to the rest of the other bumps act as wedges that are capable of allowing expansion of the two components relative to each other without any particular sticking point. The components in question are only assembled at the required instant when all the solder bumps have reached the melting temperature.

In this way, the larger-sized bumps maintain the component that is to be mounted at a height so that the other bumps are not in contact with the receiving pads or wettable surfaces before assembly so that there can be no untimely soldering due to design defects or unevenness of said components.

Obviously, using the invention must not modify the characteristics of the component that is to be hybridized. The specified pixel spacing pitch must remain unchanged and the invention therefore aims to introduce at least three bumps that are taller than the others without disrupting the spacing pitch.

In a known manner, a bump is defined firstly by its lower adhesion surface and secondly by its upper adhesion surface and finally by the volume of solder material used.

These parameters result in two other parameters that must be taken into consideration—the bump height before hybridization and the bump height after hybridization respectively.

According to the invention, the aim is to produce bumps that are as large as possible with a given pitch. In fact, such a configuration makes it all the easier to make up for any unevenness between the two components to be hybridized. Nevertheless, use of the invention does encounter the following difficulty, depending on the respective values of the interconnection pitch and the required bump height.

According to a first aspect of the invention, if the interconnection pitch exceeds twice the bump height, the invention as defined above can be applied without any difficulty. In this respect, the reader is reminded that the bump height is imposed by reliability rules, differences in the flatnesses of the components to be hybridized and the technology used to produce the bumps.

In this case, two types of bumps are required:
tall bumps in the center of the array and, as described above, at least three bumps in order to support the component to be hybridized,
low bumps everywhere else in the array.

In this configuration, the height of the tall bumps before hybridization exceeds the height of the so-called "low bumps". In contrast, the height of the tall bumps or low bumps after hybridization is substantially the same.

On the other hand, if the interconnection pitch is less than twice the height of the tall bumps, the latter then take up almost all the space allotted by the pitch. The invention involves using three types of bumps that are arranged in a particular configuration relative to each other.

Tall bumps in the center are interspersed or alternated with low bumps and there are intermediate bumps, i.e. bumps of intermediate height, everywhere else. The interspersion of tall bumps and low bumps having a height that is less than the spacing pitch makes it possible to take into account the technological limitations encountered in the center of the components to be hybridized in so far as it is necessary to preserve the interconnection pitch.

Thus, by inserting or alternating bumps having a height that is greater than the interconnection pitch and low bumps alongside tall bumps having a size that is less than said pitch, it becomes possible to adhere to the interconnection pitch.

This alternation or interconnection makes it possible to satisfy two fundamental hybridization rules, namely:
- an overall hybridization height that is as high as possible in order to facilitate cleaning after hybridization; this cleaning is intended to remove residues left by the soldering fluid, often a greasy liquid; such cleaning is performed, for instance, by jets of water;
- the greatest possible pixel volume occupied by solder, thus making it possible to increase the tolerances for differences in flatness between the components to be hybridized.

BRIEF DESCRIPTION OF THE DRAWINGS

The way in which the invention is implemented and its resulting advantages will be made more readily understandable by the descriptions of the following embodiments, given merely by way of example, reference being made to the accompanying drawings.

As stated previously.

DETAILED DESCRIPTION OF THE INVENTION

Figure 1A:
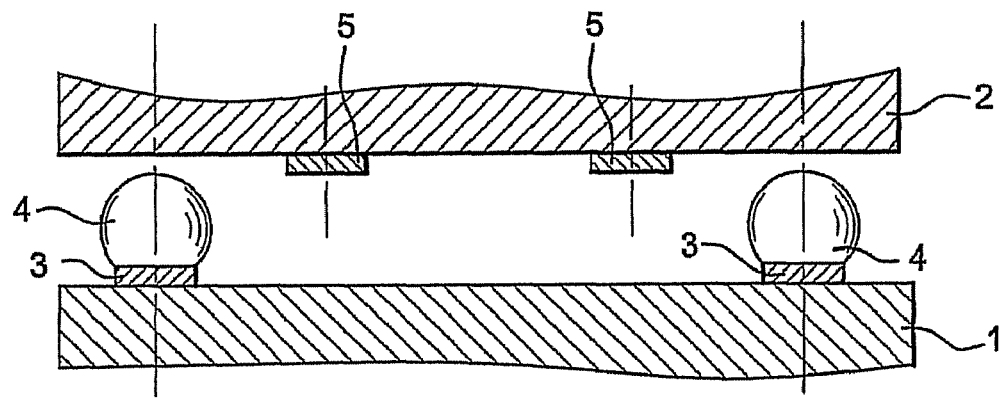
FIGS. 1a to 2b are schematic cross-sectional views of technologies according to the prior art.
Figure 1B:
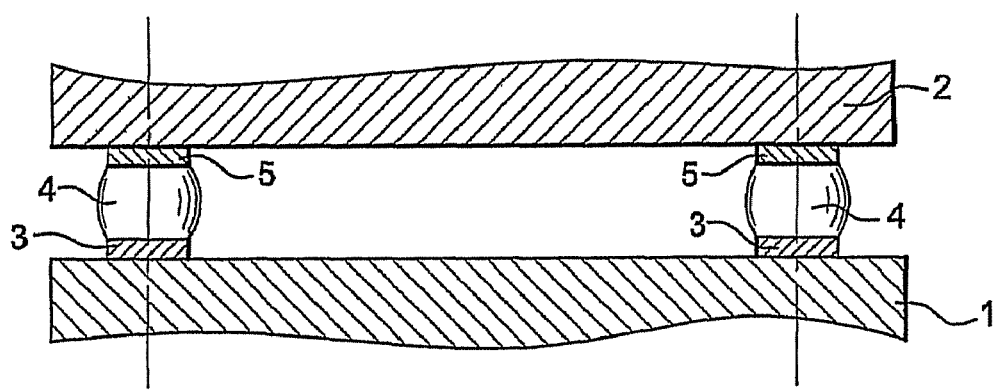
Figure 2A:
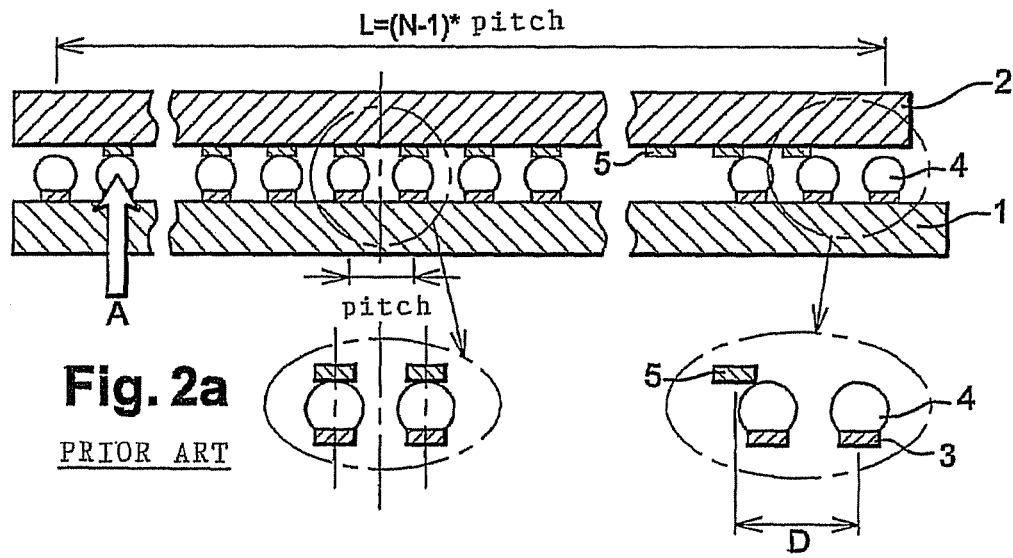
Figure 2B:
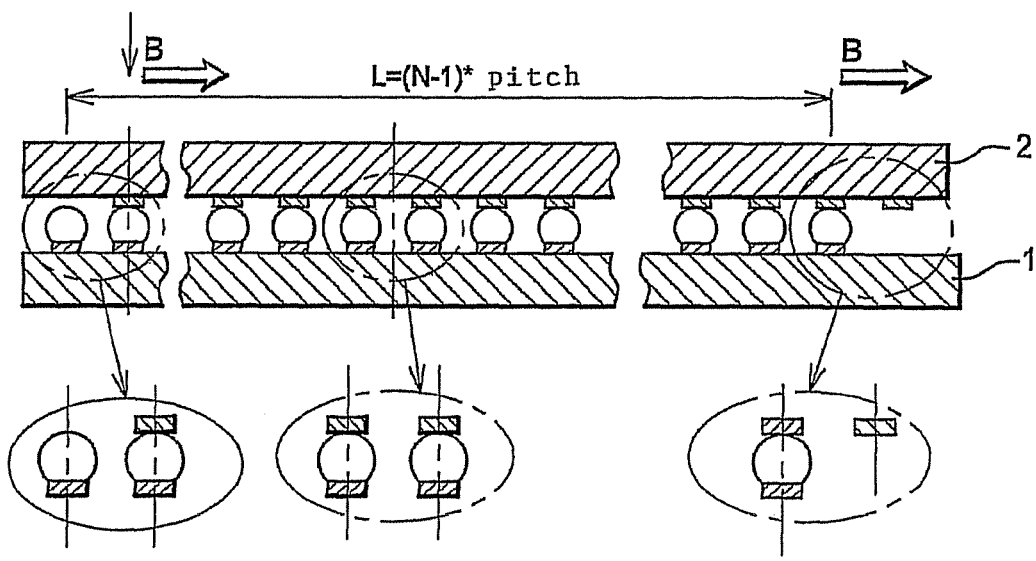
Figure 3A:
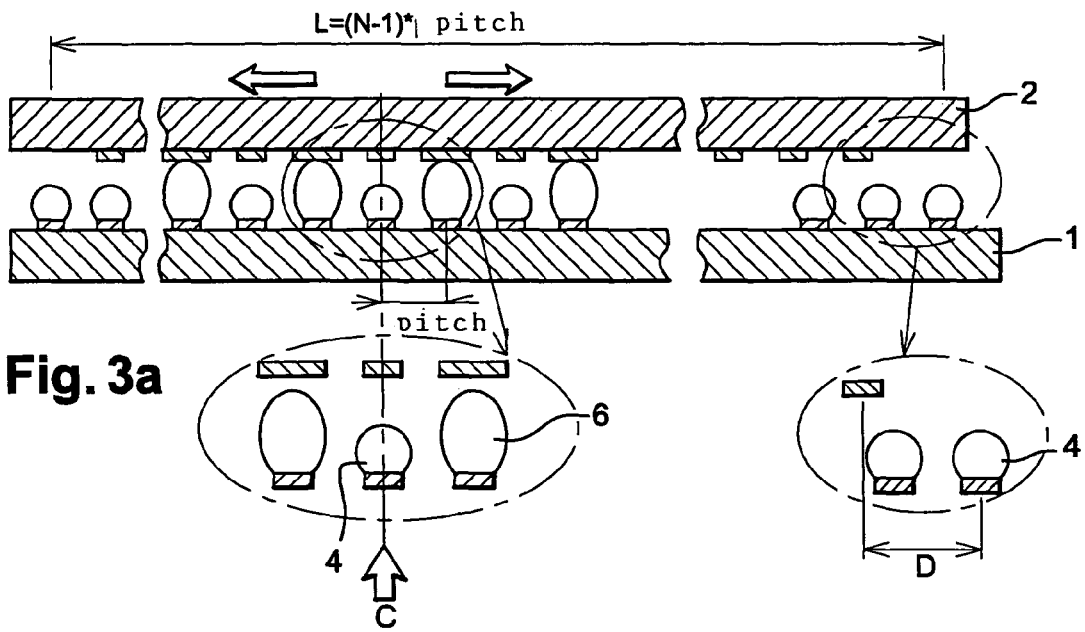
FIGS. 3a, 3b and 3c show similar views illustrating the general underlying principle of the invention.
Figure 3B:
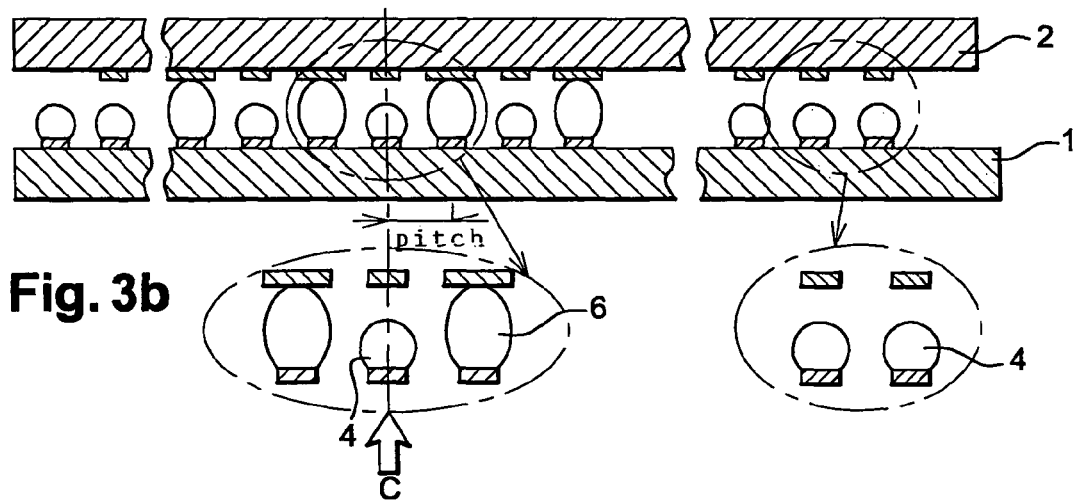
Figure 3C:
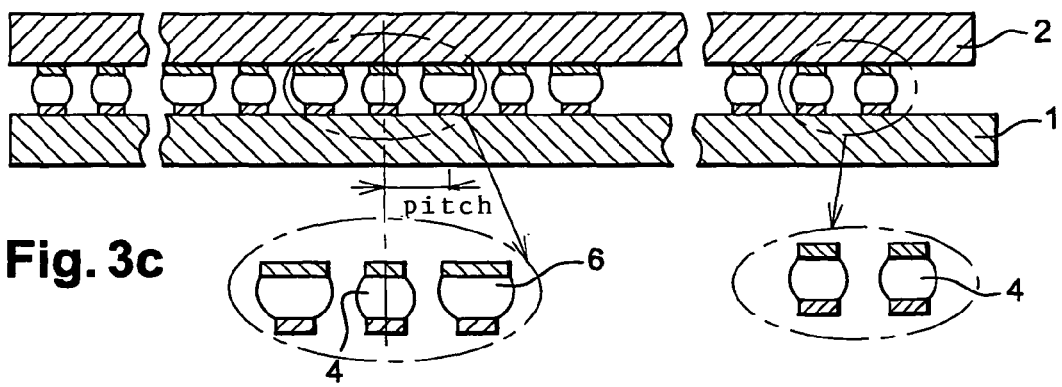
Figure 4:
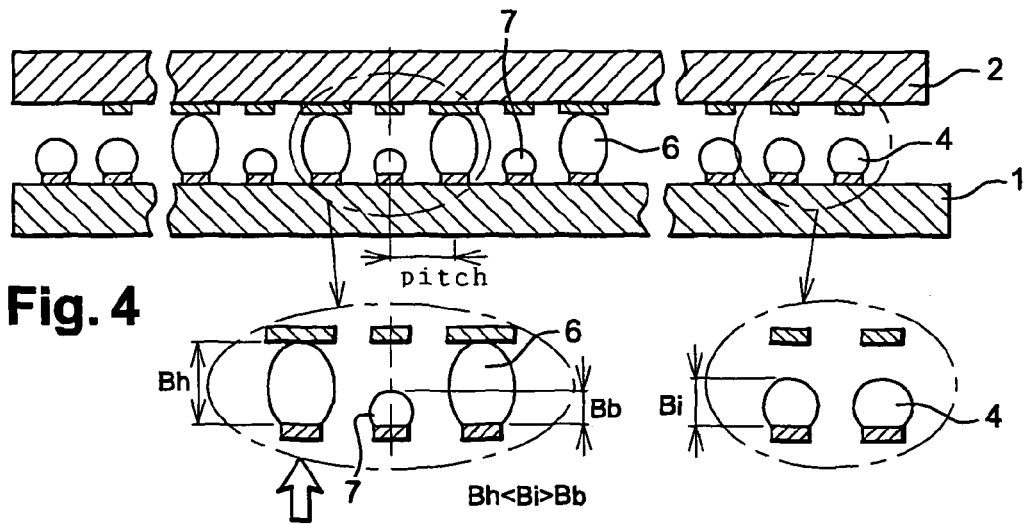
FIG. 4 is a view similar to the preceding Figures showing the special case where the interconnection pitch is less than twice the height of the "tall" bumps, FIG. 5 being a top view of the lower component.

FIGS. 3a, 3b and 3c show the general principle of the present invention and correspond, respectively, to ambient temperature, a temperature close to the melting temperature after sliding and expansion and, finally, to the respective positions of the components during hybridization, i.e. at a temperature in excess of the melting temperature of the material that constitutes the bumps.

Compared with the description previously given of the Figures for the prior art, in FIG. 3a one can see the presence of a certain number of "tall" bumps 6, i.e. bumps the height of which, at ambient temperature, clearly exceeds the height of the other hybridization and interconnection bumps strictly speaking 4, also referred to as low bumps. This being so, the respective volumes of the bumps are also different.

At ambient temperature one can see that the wettable areas or adhesion surfaces 5 of the upper component, in this case cover 2, are not in alignment with the bumps with which they are intended to cooperate. Obviously, the method of producing wettable surfaces and the method of depositing the bumps in question are not described in this document, given the fact that these technologies are perfectly well known to those skilled in the art.

Nevertheless, it may be useful to refer to other patent applications by the Applicant filed on the same day that use special developments of these technologies.

According to the invention, there are at least three tall bumps 6 and, advantageously, they are positioned in the center of the components to be hybridized. This being so, this forces the point of origin of the effects of expansion to the center of the hybridized chip. At ambient temperature it is apparent that the component to be hybridized, the cover in this case, rests only on tall bumps 6.

In the next Figure (FIG. 3b), expansion has occurred and one can see the positioning of the wettable areas or adhesion areas 5 of the upper component or cover 2 are substantially in alignment with bumps 4 with which they are intended to cooperate. Fusion has, however, not yet occurred, fusion being shown in FIG. 3c. Fusion results in the upper component 2 sinking downwards towards component 1 and, consequently, wettable areas 5 simultaneously coming into contact with hybridization bumps 4. In this respect and in order to achieve optimized hybridization, the chosen adhesion surface, especially the upper surface or wettable area of the tall bumps, is important.

In the special case where the pixel pitch is small, typically less than 15 µm, a pitch that is frequently encountered for applications involving arrays for detecting infrared radiation, one encounters the difficulty of inserting the tall bumps with such a pitch while abiding by the recommendations made for the present invention.

Consequently, in the area where the wedges 6 (tall bumps) are located, there is no room for interconnection bumps: these are then produced with a smaller size 7. This third type of bump, called a very low bump, is therefore shorter than both the other types of bump. These bumps therefore have different volumes. In contrast, all three types of bumps are distributed with the same pitch spacing: all the bump centers are in alignment.

However, the classic technologies for producing bumps are not easily compatible with producing such special bumps, especially an alternating sequence of tall bumps and low bumps.

In the case in question, one therefore makes use of a special process that involves using a technique for stamping a layer of fusion or soldering material, especially a ductile material, which may possibly conduct electricity, deposited in advance on substrate 1.

More specifically, this layer is deposited on a wettable metallic layer 14 typically made of gold which is itself deposited on a metallic layer 13 acting as a barrier and made of a nickel-based alloy for example.

Figure 6:
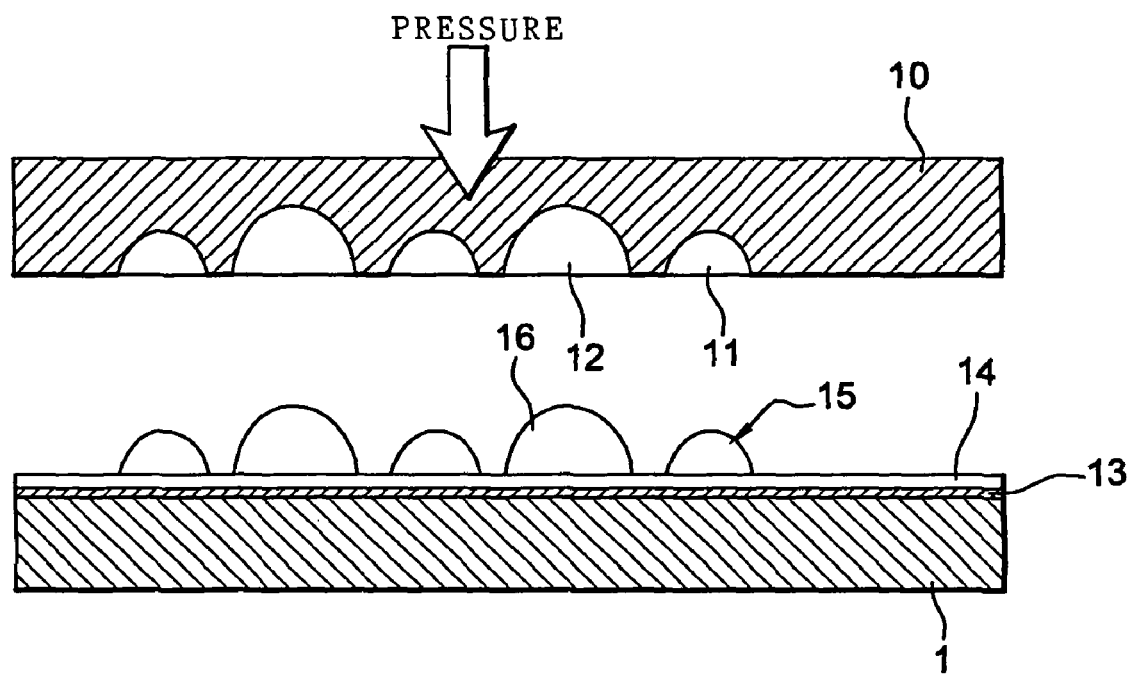
FIG. 6 is a schematic view of one embodiment of the bumps.

Stamping of the layer of ductile material is obtained using an etched die 10, e.g. made of silicon, which defines shapes 11, 12 depending on the shapes which one wishes to give to bumps 15, 16. The principle of this method of producing bumps is shown schematically in FIG. 6. This particular technology is the subject of a patent application that was filed on the same day by the Applicant.

Figure 5:
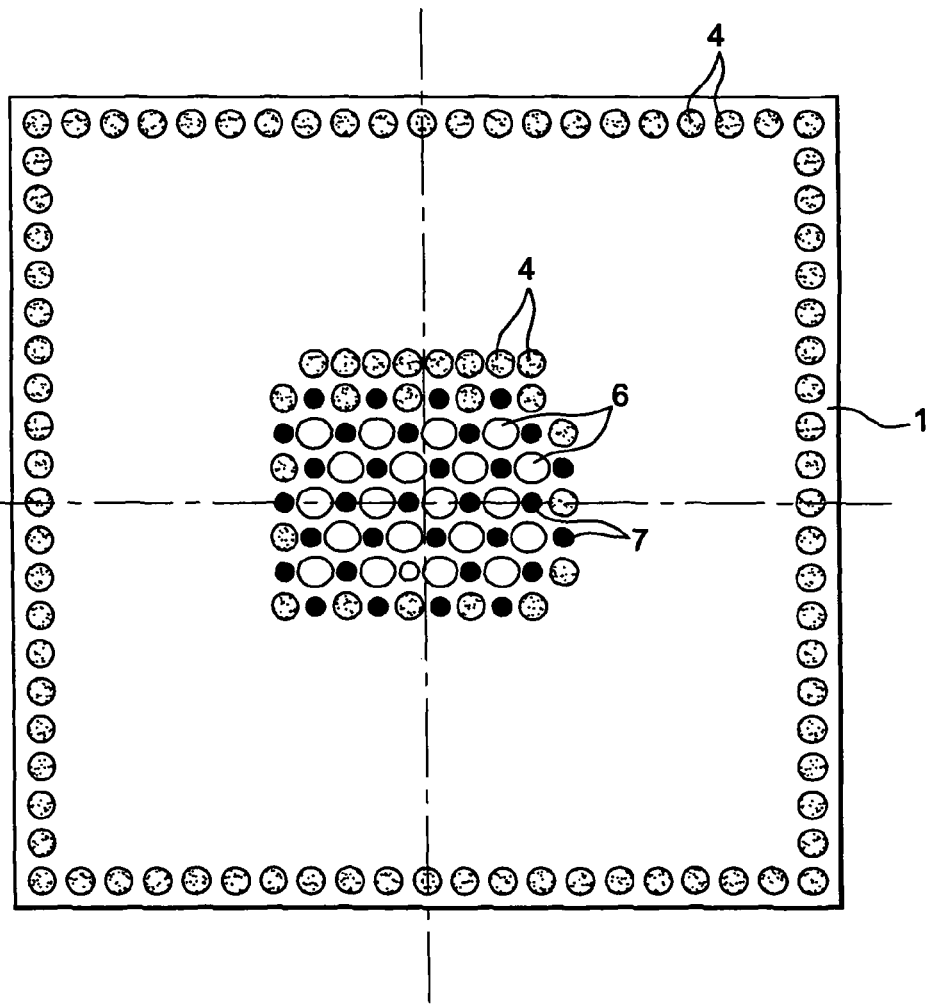

The etching produced in die 10 makes it especially easy to obtain an alternating sequence of tall bumps and low bumps in accordance with the diagram in FIG. 5, something which currently known technologies cannot achieve simply and inexpensively.

The bumps obtained after stamping are shaped by remelting, i.e. by raising the temperature until it is equal or greater than the melting temperature of the ductile material.

In this particular embodiment too, the other bumps are intermediate bumps of the type described in connection with the above Figures.

By way of example, in the particular case of a pixel pitch of less than 15 µm, one produces a central area of 400×400 pixels in the center of the die. Assuming this and with the basic numeric data stated in the preamble, the respective maximum displacement of the expansion barycenters during the increase in temperature is then limited to:

$$D = 3 \cdot 10^{-6} \times 170 \times 200 \times \text{pitch} = 1.5\ \mu m$$

In fact, at the melting temperature, the maximum misalignment of the opposite-facing surfaces is 1.5 μm, thus making it impossible for the misalignment observed using technologies according to the prior art to occur.

Given this, the method according to the invention has various applications, especially in producing large-size arrays and other linear arrays for detecting x-rays, which are especially useful in the medical field as well as in producing large-size arrays and other linear arrays for detecting infrared radiation and, generally speaking, whenever hybridization is used for large-size components, regardless whether they are linear arrays or arrays.

The invention claimed is:

1. A hybridization method, comprising the steps of:
    providing a first component with first pads for accommodating solder protrusions of a single fusible material, said first component having a first thermal expansion coefficient and a planar shape having a central region on a first surface thereof;
    providing a second component with second pads and third pads for accommodating said solder protrusions, said second component having a second thermal expansion coefficient and a planar shape having a central region on a second surface thereof, wherein said first and second pads having a first predetermined solder pad size are positioned on said first and second components, respectively, such that, at a hybridization temperature of said solder protrusions, said first and second pads of each pair of pads are substantially superimposed to form aligned pairs of pads, and such that, at ambient temperature, said first and second pads of each pair of pads are offset relative to one another by a distance that compensates for differential expansion of said first and second components between the ambient and said hybridization temperature;
    positioning said solder protrusions on said first pads of said first component, wherein some of said solder protrusions are taller than the remainder of said solder protrusions so that before the temperature is increased to the said hybridization temperature, said first and second components contact one another only through said taller solder protrusions, and
    wherein said third pads of said second component are a second predetermined solder pad size, which is larger than said first predetermined solder pad size of said first and second pads, whereby said third pads are positioned opposite to said taller solder protrusions, said taller solder protrusions being positioned only in the central region of said first component such that at least one of said taller solder protrusions at least partially overlaps the geometric center of said first component, and wherein the composition of all of said solder protrusions is the same;
    placing said second component on said first component to form an assembly, wherein said third solder pads are positioned directly above and in contact with said taller solder protrusions;
    heating said assembly to said hybridization temperature in order to interconnect each pair of opposed pads by soldering said solder protrusions to the pads; and
    cooling the resulting soldered assembly,
    wherein all of said solder protrusions in the resulting soldered assembly have convex side surfaces when viewed in cross section taken through a plane perpendicular to main planes of said first and second components.

2. The hybridization method according to claim 1, wherein the height of each solder protrusion after hybridization is substantially the same.

3. The hybridization method according to claim 1, wherein said remainder of said solder protrusions in an area outside said center of said first and second components have a first height that is shorter than that of said taller solder protrusions, and wherein said remainder of said solder protrusions in the center of said first and second components have a second height that is shorter than said first height, but all said solder protrusions in said resulting soldered assembly have substantially the same height.

4. The hybridization method according to claim 3, wherein the solder protrusions having the second height are interdispersed with the taller protrusions in the center of said first and second components.

* * * * *